(12) United States Patent
Takeshima

(10) Patent No.: US 11,815,579 B2
(45) Date of Patent: Nov. 14, 2023

(54) MAGNETIC RESONANCE IMAGING APPARATUS AND METHOD

(71) Applicant: Canon Medical Systems Corporation, Otawara (JP)

(72) Inventor: Hidenori Takeshima, Kawasaki (JP)

(73) Assignee: Canon Medical Systems Corporation, Otawara (JP)

(*) Notice: Subject to any disclaimer, the term of this patent is extended or adjusted under 35 U.S.C. 154(b) by 0 days.

(21) Appl. No.: 17/805,944

(22) Filed: Jun. 8, 2022

(65) Prior Publication Data
US 2022/0397622 A1 Dec. 15, 2022

(30) Foreign Application Priority Data

Jun. 10, 2021 (JP) ................................. 2021-097404

(51) Int. Cl.
G01R 33/54 (2006.01)
G01R 33/48 (2006.01)
G01R 33/56 (2006.01)

(52) U.S. Cl.
CPC ....... *G01R 33/543* (2013.01); *G01R 33/4818* (2013.01); *G01R 33/5608* (2013.01)

(58) Field of Classification Search
CPC .............. G01R 33/543; G01R 33/4818; G01R 33/5608; G01R 33/5611; G01R 33/5619
See application file for complete search history.

(56) References Cited

U.S. PATENT DOCUMENTS

| 10,274,567 B2 | 4/2019 | Takeshima | |
|---|---|---|---|
| 2008/0242972 A1* | 10/2008 | Jung | G01R 33/5611 600/410 |
| 2013/0285662 A1* | 10/2013 | Takeshima | G01R 33/34 324/318 |
| 2015/0276908 A1* | 10/2015 | Takeshima | G01R 33/5611 324/322 |

(Continued)

FOREIGN PATENT DOCUMENTS

| JP | 2014-69007 A | 4/2014 |
|---|---|---|
| JP | 2019-93126 A | 6/2019 |
| JP | 2019-111322 A | 7/2019 |

OTHER PUBLICATIONS

Tsao et al., "k-t BLAST and k-t SENSE: Dynamic MRI With High Frame Rate Exploiting Spatiotemporal Correlations", Magnetic Resonance in Medicine 50, 2003, 12 Pages.

(Continued)

*Primary Examiner* — G. M. A Hyder
(74) *Attorney, Agent, or Firm* — Oblon, McClelland, Maier & Neustadt, L.L.P.

(57) ABSTRACT

According to one embodiment, a magnetic resonance imaging apparatus includes sequence control circuitry and processing circuitry. The sequence control circuitry performs under-sampled data acquisition whose sample points are located at an equal interval in k-space and acquires k-space frames. The processing circuitry generates a plurality of k-space frames related to a plurality of time resolutions based on the k-space frames. In each of the plurality of k-space frames, the sample points are located at an equal interval, and the interval differs for each of the plurality of k-space frames. The processing circuitry generates a time-series image based on the plurality of k-space frames.

13 Claims, 10 Drawing Sheets

(56) References Cited

U.S. PATENT DOCUMENTS

| | | | |
|---|---|---|---|
| 2016/0003928 A1* | 1/2016 | Chen | G01R 33/4822 |
| | | | 324/309 |
| 2017/0069115 A1* | 3/2017 | Saito | G06T 11/006 |
| 2019/0287674 A1 | 9/2019 | Nitta et al. | |
| 2019/0336033 A1 | 11/2019 | Takeshima | |

OTHER PUBLICATIONS

Takeshima et al., "Estimation of Spatiotemporal Sensitivity Using Band-Limited Signals with No Additional Acquisitions for k-t Parallel Imaging", Magnetic Resonance in Medical Sciences, Feb. 7, 2018, 10 pages.

Pedersen et al., "k-t PCA: Temporally Constrained k-t BLAST Reconstruction Using Principal Component Analysis", Magnetic Resonance in Medicine 62, 2009, 11 Pages.

Extended European Search Report dated Nov. 3, 2022 in European Patent Application No. 22178109.9, citing references 24-26 therein, 12 pages.

Takeshima et al., "Fast Acquisition and Low-delay Reconstruction of Stack-of-stars Trajectory Using Temporal Multiresolution Images and a Convolutional Neural Network", Proceedings of the International Society for Magnetic Resonance in Medicine, $27^{th}$ Annual Meeting and Exhibition, No. 467, 2019, 5 pages, XP040707854.

Kutsuna et al., "Acquisition of High-resolution Time Intensity Curves Using a Deep Learning Reconstruction for Dynamic Contrast Enhanced MRI", Proceedings of the 2021 ISMRM & SMRT Annual Meeting & Exhibition, No. 2106, 2021, 5 pages, XP040724125.

Takeshima et al., "k-t CNN for Modeling Spatio-temporal Mappings and an Application to Reconstruction of k-space Data with Stack-of-spirals Trajectory", Proceedings of the ISMRM & SMRT Virtual Conference & Exhibition, No. 3623, 2020, 5 pages, XP040717538.

* cited by examiner

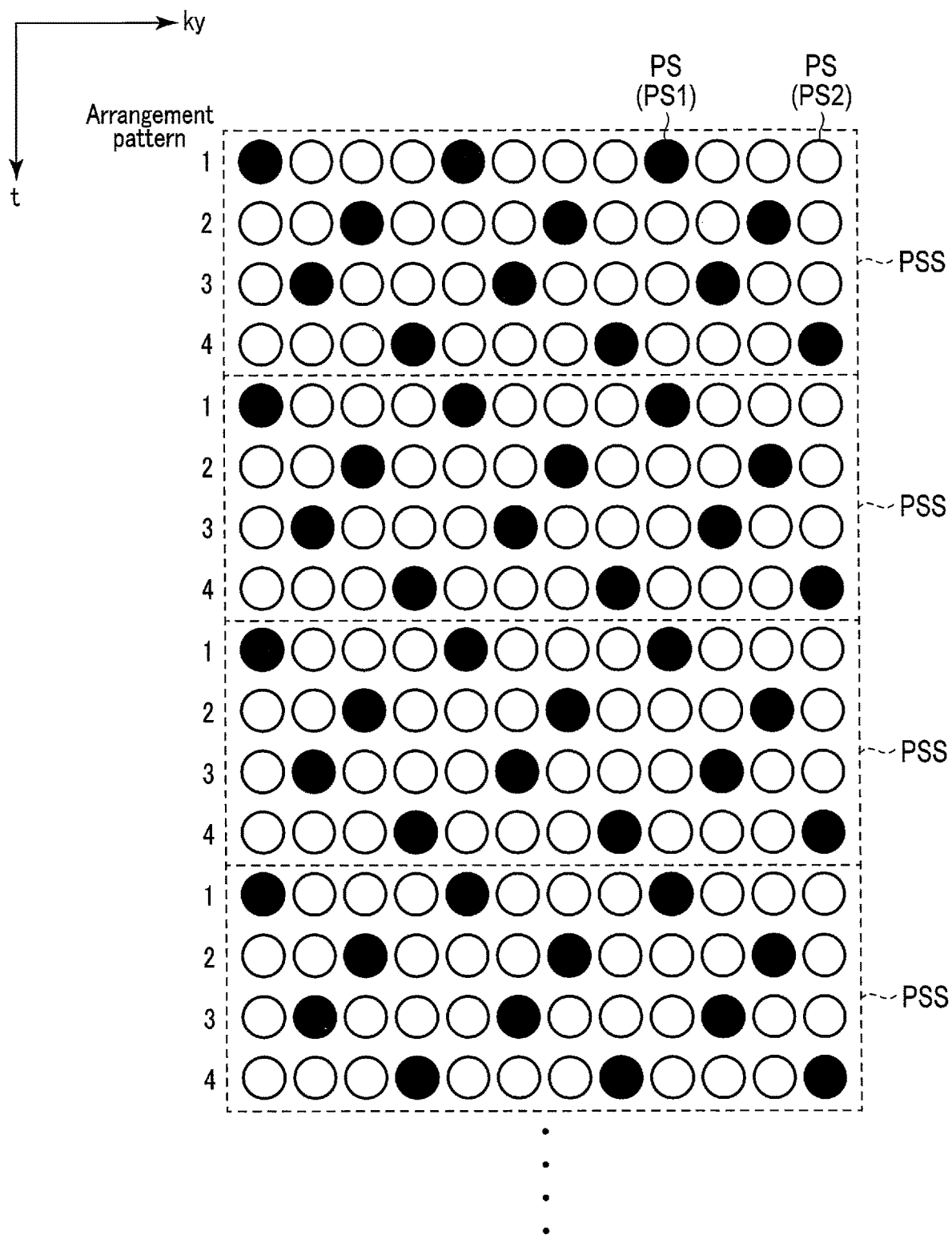
F I G. 3

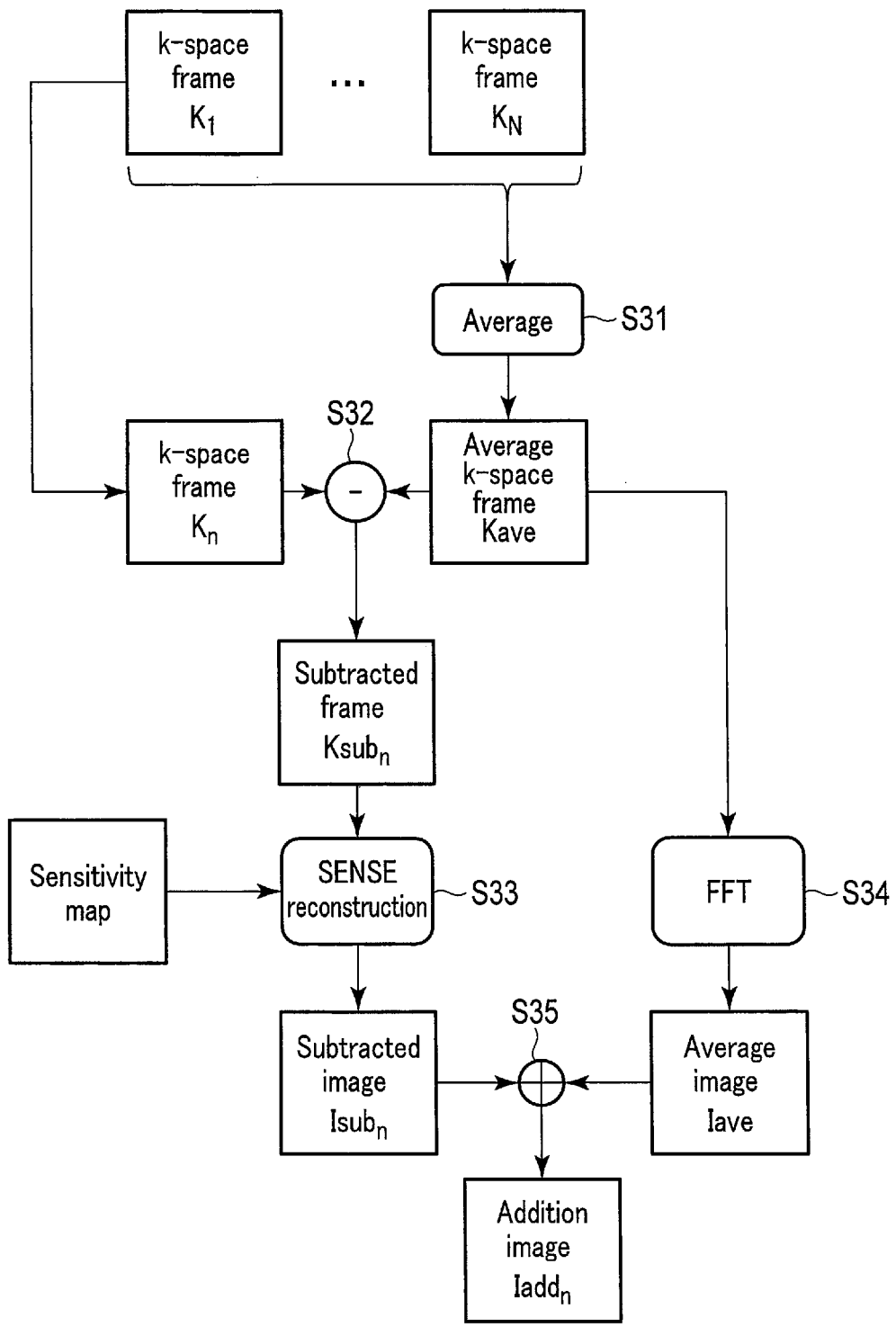
F I G. 7

MAGNETIC RESONANCE IMAGING APPARATUS AND METHOD

CROSS-REFERENCE TO RELATED APPLICATIONS

This application is based upon and claims the benefit of priority from Japanese Patent Application No. 2021-097404, filed Jun. 10, 2021, the entire contents of which are incorporated herein by reference.

FIELD

Embodiments described herein relate generally to a magnetic resonance imaging apparatus and method.

BACKGROUND

As an under-sampled data acquisition technique for time-series k-space data, there is a technique called k-t BLAST (k-space time Broad-use Linear Acquisition Speed-up Technique) or k-t SENSE (sensitivity encoding).

BRIEF DESCRIPTION OF THE DRAWINGS

FIG. 3 is a diagram showing an arrangement example of sample points in under-sampled data acquisition according to the present embodiment.

FIG. 7 is a diagram showing a processing example of image conversion using SENSE in a subtraction frame.

DETAILED DESCRIPTION

A magnetic resonance imaging apparatus according to an embodiment includes sequence control circuitry and processing circuitry. The sequence control circuitry performs under-sampled data acquisition whose sample points are located at an equal interval in k-space and acquires k-space frames. The processing circuitry generates a plurality of k-space frames related to a plurality of time resolutions based on the k-space frames. Here, in each of the plurality of k-space frames, sample points are located at an equal interval, and the interval differs for each of the plurality of k-space frames. The processing circuitry generates a time-series image based on the plurality of k-space frames.

Hereinafter, an embodiment of the magnetic resonance imaging apparatus and method will be described in detail with reference to the accompanying drawings.

Figure 1:
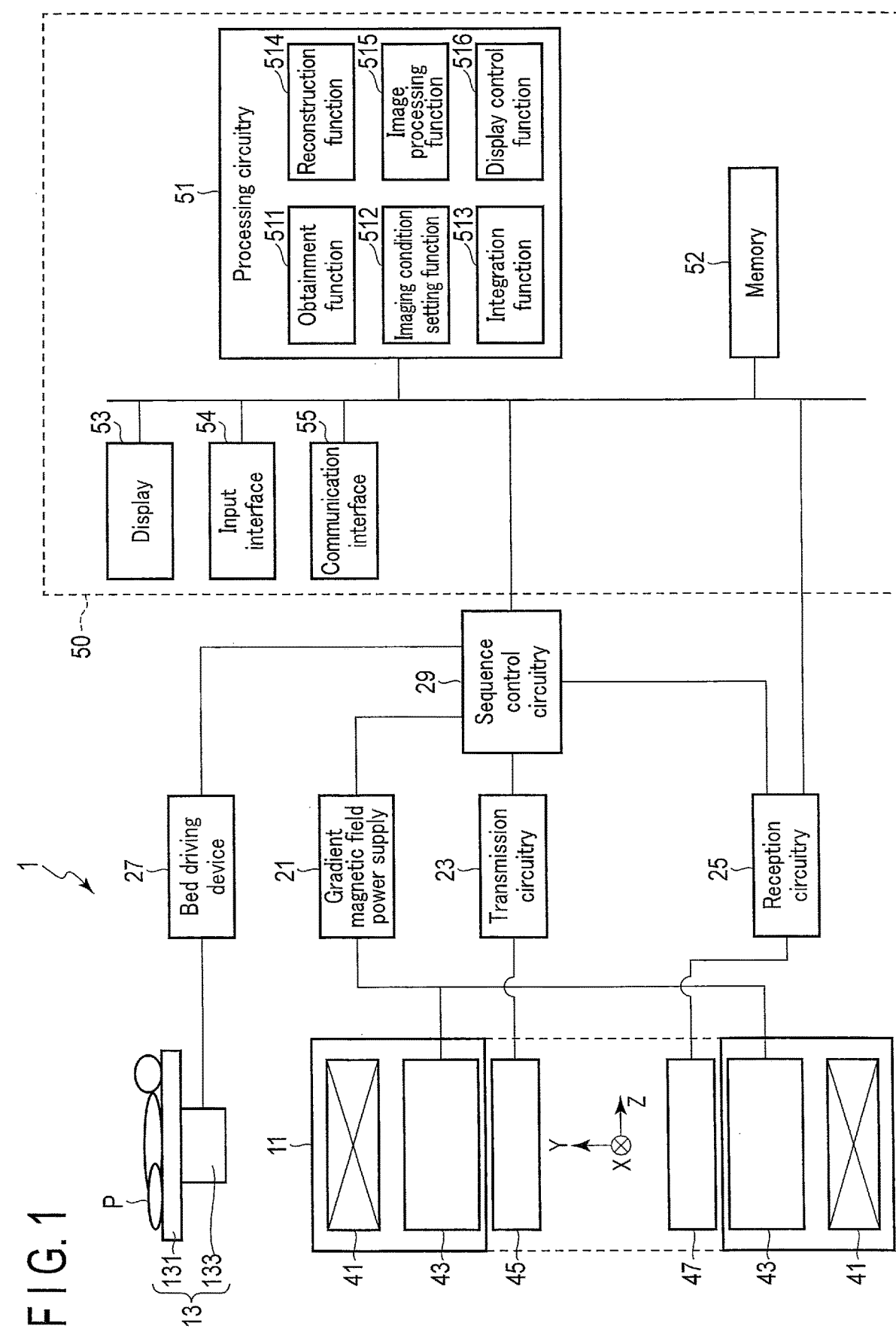
FIG. 1 is a diagram showing a configuration of a magnetic resonance imaging apparatus according to a present embodiment.

FIG. 1 is a diagram showing a configuration of a magnetic resonance imaging apparatus 1 according to the present embodiment. As shown in FIG. 1, the magnetic resonance imaging apparatus 1 includes a gantry 11, a bed 13, a gradient magnetic field power supply 21, transmission circuitry 23, reception circuitry 25, a bed driving device 27, sequence control circuitry 29, and a host computer 50.

The gantry 11 includes a static magnetic field magnet 41 and a gradient magnetic field coil 43. The static magnetic field magnet 41 and the gradient magnetic field coil 43 are accommodated in a housing of the gantry 11. The housing of the gantry 11 is formed with a bore having a hollow shape. A transmitter coil 45 and a receiver coil 47 are arranged in the bore of the gantry 11.

The static magnetic field magnet 41 has a hollow approximately cylindrical shape, and generates a static magnetic field inside an approximately cylindrical interior. Examples of the static magnetic field magnet 41 used include a permanent magnet, a superconducting magnet, or a normal conducting magnet. Here, a central axis of the static magnetic field magnet 41 is defined as a Z axis, an axis vertically orthogonal to the Z axis is defined as a Y axis, and an axis horizontally orthogonal to the Z axis is defined as an X axis. The X axis, Y axis, and Z axis constitute an orthogonal three-dimensional coordinate system.

The gradient magnetic field coil 43 is a coil unit attached to the inside of the static magnetic field magnet 41 and formed in a hollow approximately cylindrical shape. The gradient magnetic field coil 43 receives a supply of a current from the gradient magnetic field power supply 21 to generate a gradient magnetic field. More specifically, the gradient magnetic field coil 43 has three coils corresponding to the X axis, the Y axis, and the Z axis orthogonal to one another. Those three coils form a gradient magnetic field in which a magnetic field strength changes along the X axis, the Y axis, and the Z axis, respectively. The gradient magnetic fields respectively along the X axis, the Y axis, and the Z axis are combined to form a slice selection gradient magnetic field Gs, a phase encoding gradient magnetic field Gp, and a frequency encoding gradient magnetic field Gr that are orthogonal to one another in desired directions. The slice selection gradient magnetic field Gs is used to determine an imaging cross section (slice) discretionarily. The phase encoding gradient magnetic field Gp is used to change a phase of a magnetic resonance signal (hereinafter, referred to as an MR signal) in accordance with a spatial position. The frequency encoding gradient magnetic field Gr is used to change a frequency of an MR signal in accordance with a spatial position. In the following descriptions, it is assumed that a gradient direction of the slice selection gradient magnetic field Gs aligns with the Z axis, a gradient direction of the phase encoding gradient magnetic field Gp aligns with the Y axis, and a gradient direction of the frequency encoding gradient magnetic field Gr aligns with the X axis.

The gradient magnetic field power supply 21 supplies a current to the gradient magnetic field coil 43 in accordance with a sequence control signal from the sequence control circuitry 29. The gradient magnetic field power supply 21 supplies a current to the gradient magnetic field coil 43 and causes the gradient magnetic field coil 43 to generate a gradient magnetic field along each of the X axis, Y axis, and Z axis. That gradient magnetic field is superimposed on a static magnetic field formed by the static magnetic field magnet 41 and is applied to a subject P.

The transmitter coil 45 is, for example, arranged inside the gradient magnetic field coil 43, and generates a high-frequency pulse (hereinafter, referred to as an RF pulse) upon receiving a current supplied from the transmission circuitry 23.

The transmission circuitry 23 supplies a current to the transmitter coil 45 in order to apply an RF pulse for exciting a target proton existing in the subject P to the subject P via the transmitter coil 45. The RF pulse oscillates at a resonance frequency specific to the target proton to excite the target proton. An MR signal is generated from the excited target proton and is detected by the receiver coil 47. The transmitter coil 45 is, for example, a whole-body coil (WB coil). The whole-body coil may be used as a transmitter/receiver coil.

The receiver coil 47 receives the MR signal emitted from the target proton existing in the subject P in response to an action of an RF magnetic field pulse. The receiver coil 47 has a plurality of receiver coil elements capable of receiving the MR signal. The received MR signal is supplied to the reception circuitry 25 via wire or wirelessly. Although not shown in FIG. 1, the receiver coil 47 has a plurality of reception channels implemented in parallel. Each reception channel has a receiver coil element that receives an MR signal, an amplifier that amplifies an MR signal, etc. An MR signal is output for each reception channel. The total number of reception channels may be equal to, larger than, or smaller than the total number of receiver coil elements.

The reception circuitry 25 receives an MR signal generated from the excited target proton via the receiver coil 47. The reception circuitry 25 processes the received MR signal to generate a digital MR signal. The digital MR signal can be expressed by k-space defined by a spatial frequency. Thus, hereinafter, the digital MR signal will be referred to as k-space data. The k-space data is a type of raw data used for image reconstruction. The k-space data is supplied to the host computer 50 via wire or wirelessly.

The transmitter coil 45 and the receiver coil 47 described above are merely examples. Instead of the transmitter coil 45 and the receiver coil 47, a transmitter/receiver coil having a transmitting function and a receiving function may be used. Also, the transmitter coil 45, the receiver coil 47, and the transmitter/receiver coil may be combined.

The bed 13 is installed adjacent to the gantry 11. The bed 13 has a top plate 131 and a base 133. The subject P is placed on the top plate 131. The base 133 slidably supports the top plate 131 along each of the X axis, the Y axis, and the Z axis. The bed driving device 27 is accommodated in the base 133. The bed driving device 27 moves the top plate 131 under the control of the sequence control circuitry 29. The bed driving device 27 may, for example, include any motor such as a servo motor or a stepping motor.

The sequence control circuitry 29 has a processor of a central processing unit (CPU) or a micro processing unit (MPU) and a memory such as a read only memory (ROM) or a random access memory (RAM) as hardware resources. The sequence control circuitry 29 synchronously controls the gradient magnetic field power supply 21, the transmission circuitry 23, and the reception circuitry 25 based on an imaging condition set by an imaging condition setting function 512 of the processing circuitry 51, executes MR imaging on the subject P in accordance with a pulse sequence according to that imaging condition, and acquires k-space data relating to the subject P.

The sequence control circuitry 29 according to the present embodiment performs under-sampled data acquisition whose sample points are located at an equal interval in k-space, and obtains time-series k-space data. A set of k-space data that forms one frame is called a k-space frame. A time resolution of a k-space frame acquired by under-sampled data acquisition is discretionarily set. The time resolution means a time width of an acquisition period of k-space data over all sample points filled in one k-space frame. When one k-space frame is composed of k-space data over a relatively narrow time range, it means that the time resolution is higher than when it is composed of k-space data over a relatively wide time range.

As shown in FIG. 1, the host computer 50 is a computer having processing circuitry 51, a memory 52, a display 53, an input interface 54, and a communication interface 55.

The processing circuitry 51 has a processor such as a CPU as a hardware resource. The processing circuitry 51 functions as the main unit of the magnetic resonance imaging apparatus 1. For example, the processing circuitry 51 executes various types of programs to implement an obtainment function 511, an imaging condition setting function 512, an integration function 513, a reconstruction function 514, an image processing function 515, and a display control function 516. The various programs are stored in a non-transitory computer-readable storage medium such as the memory 52.

Through implementation of the obtainment function 511, the processing circuitry 51 obtains various types of data. For example, the processing circuitry 51 obtains a k-space frame acquired by the sequence control circuitry 29. The processing circuitry 51 may obtain a k-space frame directly from the sequence control circuitry 29 or the reception circuitry 25, or store a k-space frame once in the memory 52 and obtain it from that memory 52.

Through implementation of the imaging condition setting function 512, the processing circuitry 51 sets an imaging condition for under-sampled data acquisition automatically or manually. For example, the processing circuitry 51 can set any imaging condition such as echo time TE, repetition time TR, imaging range (FOV), k-space trajectory type, or reduction factor (double speed factor), as one of the imaging conditions.

Through implementation of the integration function 513, the processing circuitry 51 generates a plurality of k-space frames related to a plurality of time resolutions based on the k-space frame. In each of the plurality of k-space frames, sample points are located at an equal interval (pitch), and the interval differs for each of the plurality of k-space frames. An interval corresponds to a distance between sample points in k-space. The interval differs among the plurality of k-space frames. In each k-space frame, sample points are located at an equal interval corresponding to that time resolution.

Through implementation of the reconstruction function 514, the processing circuitry 51 generates a time-series image based on a plurality of k-space frames related to a plurality of time resolutions. A time-series image is time-series MR image data. A time resolution of the time-series image can be set discretionarily. For example, a time resolution of a time-series image may be set to any time resolution among time resolutions of a plurality of k-space frames which are original data, or a time resolution different from the time resolutions of the plurality of k-space frames which are the original data.

Through the implementation of the image processing function 515, the processing circuitry 51 performs various image processing on a time-series image. For example, the processing circuitry 51 performs image processing such as volume rendering, surface rendering, pixel value projection processing, multi-planer reconstruction (MPR) processing, and curved MPR (CPR) processing. The processing circuitry 51 is also capable of performing various processing such as area extraction, image recognition, image analysis, and positioning, as the image processing.

Through implementation of the display control function 516, the processing circuitry 51 displays various information on the display 53. For example, the processing circuitry 51 displays the time-series image, etc. generated by the reconstruction function 514 on the display 53.

The memory 52 is a memory device such as a hard disk drive (HDD), a solid state drive (SSD), or an integrated circuit memory device that stores various information. The memory 52 may be a driving device that reads and writes various information from and in a portable storage medium such as a CD-ROM drive, a DVD drive, or a flash memory. For example, the memory 52 stores an imaging condition, a k-space frame, a time-series image, a program, etc.

The display 53 displays various information by the display control function 516. As the display 53, for example, a CRT display, a liquid crystal display, an organic EL display, an LED display, a plasma display, or any other display known in the relevant technical field can be used as appropriate.

The input interface 54 includes an input device that receives various commands from a user. As an input device, a keyboard, a mouse, various switches, a touch screen, a touch pad, etc. can be used. The input device is not limited to a device equipped with physical operation parts such as a mouse and a keyboard. For example, electric signal processing circuitry that receives an electric signal corresponding to an input operation from an external input device provided separately from the magnetic resonance imaging apparatus 1 and outputs the received electric signal to various circuits is also included in the examples of the input interface 54. The input interface 54 may also be a voice recognition device that receives a voice signal acquired via a microphone and converts the voice signal into an instruction signal.

The communication interface 55 is an interface that connects the magnetic resonance imaging apparatus 1 with a workstation, a picture archiving and communication system (PACS), a hospital information system (HIS), a radiology information system (RIS), etc. via a local area network (LAN), etc. A network IF sends and receives various information to and from the connected workstation, PACS, HIS, and RIS.

The above configuration is an example and is not limited thereto. For example, the sequence control circuitry 29 may be incorporated in the host computer 50. Further, the sequence control circuitry 29 and the processing circuitry 51 may be mounted on the same board. The imaging condition setting function 512 does not necessarily have to be mounted on the processing circuitry 51 of the magnetic resonance imaging apparatus 1. For example, the imaging condition setting function 512 may be mounted on a computer for setting an imaging condition which is separate from the magnetic resonance imaging apparatus 1. In this case, an imaging condition generated by that computer is supplied to the magnetic resonance imaging apparatus 1 via a network, a portable recording medium, etc. Further, a storage area of an imaging condition in the memory 52 does not need to be mounted on the magnetic resonance imaging apparatus 1, and may be mounted on a memory device connected to the magnetic resonance imaging apparatus 1 via a network, for example.

Figure 2:
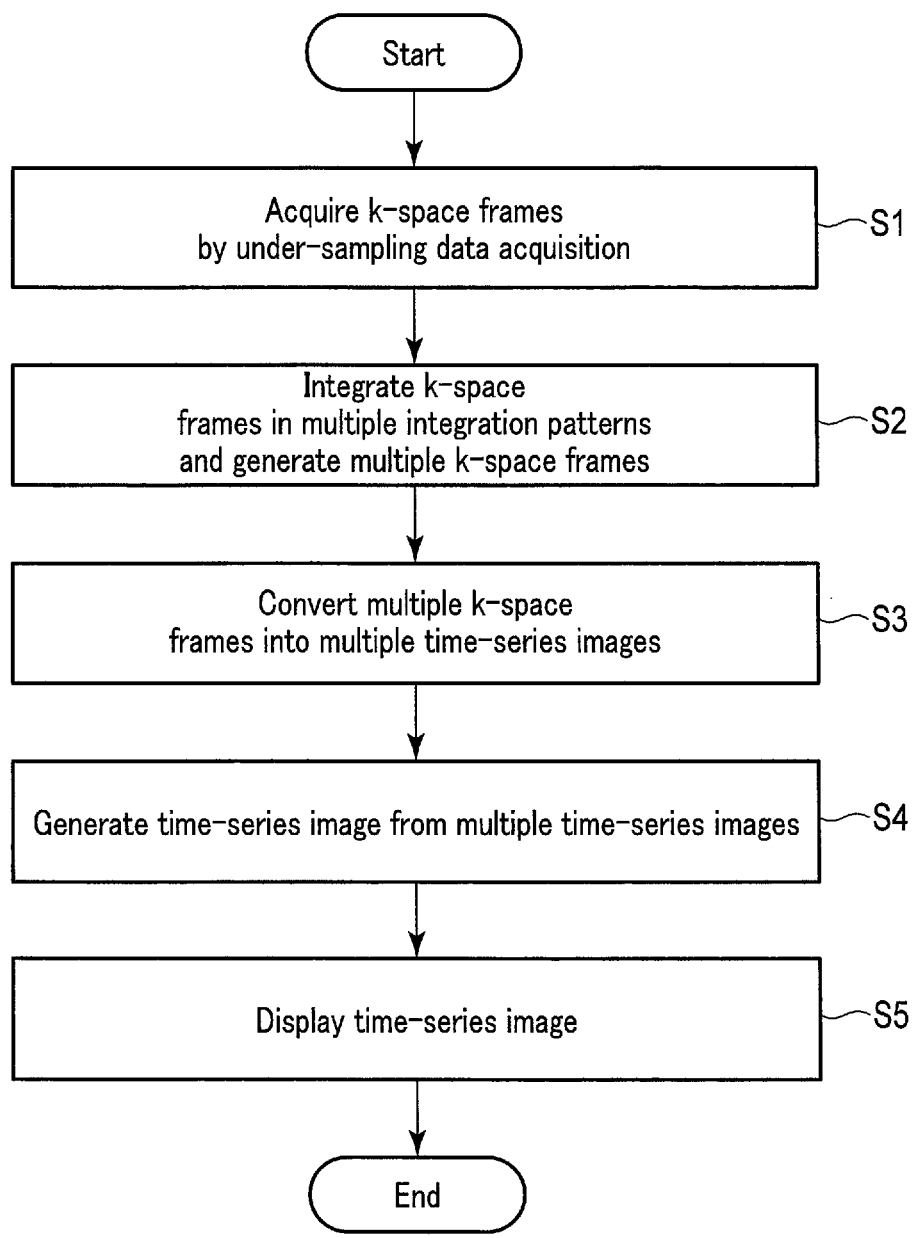
FIG. 2 is a diagram showing an example of a flow of an MR examination according to the present embodiment.

FIG. 2 is a diagram showing an example of a flow of an MR examination according to the present embodiment. The processing circuitry 51 reads a program related to the MR examination from the memory 52 and executes it when the user gives an instruction to start the MR examination via the input interface 54, etc. By executing that program, the processing circuitry 51 executes a series of processing shown in FIG. 2. The program may be composed of a single module in which a series of processing shown in FIG. 2 is described, or may be composed of a plurality of modules in which a series of processing are shared and described. At the start of step S1, it is assumed that an imaging condition related to under-sampled data acquisition is set by the imaging condition setting function 512.

As shown in FIG. 2, the sequence control circuitry 29 acquires time-series k-space data (hereinafter, k-space data corresponding to one time-series image is referred to as a k-space frame) by the under-sampled data acquisition (step S1). In step S1, the sequence control circuitry 29 synchronously controls the gradient magnetic field power supply 21, the transmission circuitry 23, and the reception circuitry 25 according to the imaging condition, executes the under-sampled data acquisition for the subject P, and acquires k-space frames via the reception circuitry 25. A k-space frame acquired by under-sampled data acquisition may be referred to as an acquired k-space frame, and a time resolution thereof may be referred to as a time resolution on acquisition. In the present embodiment, sample points on which data acquisition is performed are set so that sample points of each k-space frame after integration by the integration function 513 are under-sampled at an equal interval.

FIG. 3 is a diagram showing an arrangement example of sample points PS in the under-sampled data acquisition according to the present embodiment. FIG. 3 shows an arrangement example of the sample points PS in a time-series k-space. The abscissa axis is a phase encoding direction axis ky, which is a k-space axis from which the sample points PS are under-sampled, and the ordinate axis is defined as a temporal axis t. In the data acquisition according to the present embodiment, it is assumed that the Cartesian method is used as a k-space filling locus and therefore the sample points PS are located in a grid pattern in k-space. Such an arrangement of the sample points PS is called a Cartesian grid. In the present embodiment, the sample points PS are assumed to be under-sampled in the phase encoding direction, and are not under-sampled in a frequency encoding direction orthogonal to the phase encoding direction. Thus, the frequency encoding direction is omitted in FIG. 3, etc. The phase encoding direction does not have to be ky. Further, the explanation based on FIG. 3 does not limit the under-sampling to the two directions of ky and kz. For example, any one of those directions may be treated as equivalent to ky of FIG. 3, and the remaining direction may be treated as a target of a general under-sampling reconstruction technique.

A black circle sample point PS1 in FIG. 3 represents a sample point on which data acquisition is performed in the under-sampled data acquisition, and a white circle sample point PS2 represents a sample point on which data acquisition is not performed. One lateral row corresponds to one k-space frame. An interval between adjacent sample points PS corresponds to a reduction factor R=1, that is, an interval in full sampling. In the under-sampled data acquisition, the sample points PS1 are located at an interval according to the reduction factor. FIG. 3 exemplifies an arrangement of the sample points PS at a reduction factor R=4. In this case, the sample points PS1 are located at an interval four times the interval of R=1. That is, three sample points PS2 are located between adjacent sample points PS1. Strictly speaking, data acquisition is performed at different times for different sample points PS1 belonging to the same k-space frame, but different sample points PS1 belonging to the same k-space frame belong to the same time.

The sequence control circuitry 29 performs under-sampled data acquisition while changing the arrangement of the sample points PS1 in time series. When the reduction factor R=M (M is a natural number of 2 or more), the sample points PS1 are changed so that data acquisition is performed for all the sample points PS when acquisition of M k-space frames is performed. Here, a pattern of arrangement of the sample points PS1 and PS2 at each k-space frame, in other words, at each time, is called an arrangement pattern. When the reduction factor R=4, four arrangement patterns are set. A set PSS of M arrangement patterns is repeated along the time series. In the present embodiment, the arrangement pattern or the sample point PS1 is not set in such a manner that the sample points PS1 are located continuously along the ky direction with a passage of time. In the present embodiment, the sample points PS2 are set discontinuously so that the sample points of each k-space frame after integration by the integration function 513 are under-sampled at an equal interval. Details of the arrangement of the sample points PS1 and PS2 will be described later. In the example of FIG. 3, it is assumed that the sample points PS1 are changed so that data acquisition is performed for all the sample points PS when acquisition of M k-space frames is performed. However, data acquisition does not necessarily have to be performed for all the sample points PS, and data acquisition may not be performed for a discretionary sample point.

When step S1 is performed, the processing circuitry 51 integrates the k-space frames (acquired k-space frames) acquired in step S1 in a plurality of integration patterns, and generates a plurality of k-space frames (integrated k-space frames) related to a plurality of time resolutions, through implementation of the integration function 513 (step S2). The processing circuitry 51 generates a plurality of integrated k-space frames by sequentially extracting, from the acquired k-space frames, and integrating the number of k-space frames according to a time resolution or reduction factor corresponding to each of the plurality of integration patterns while staggering the time. The processing circuitry 51 integrates the number of k-space frames according to a time resolution or reduction factor that are continuous or spaced apart in the temporal axis direction.

In the present embodiment, the processing circuitry 51 generates a plurality of integrated k-space frames by sequentially applying an integration window according to the time resolution or reduction factor corresponding to each of the plurality of integration patterns to the acquired k-space frames while staggering the time. When the integration window is applied to the acquired k-space frames, the processing circuitry 51 fixes or varies a position of a base frame in the integration window in time. The integration window is a filter that extracts and integrates k-space frames included in that integration window. The base frame refers to a k-space frame of an application reference by an integration window. In other words, the base frame is a k-space frame that serves as a reference for an integrated k-space frame. The same base frame is processed by a plurality of integration windows related to different time resolutions. Specifically, as the integration, an average such as a simple average or a weighted addition average of a plurality of acquired k-space frames may be used.

Figure 4:
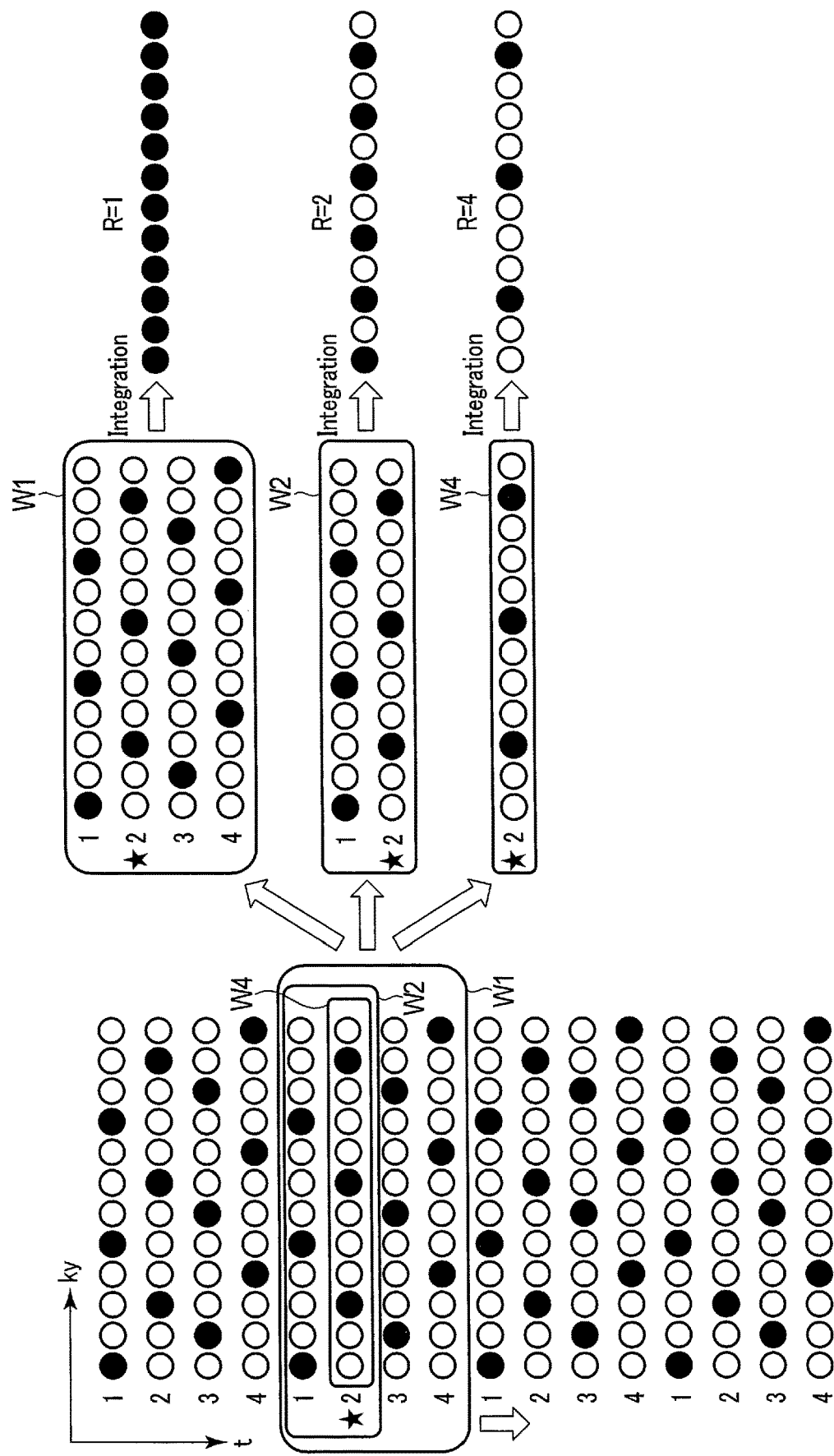
FIG. 4 is a diagram schematically showing an integration process (a base frame is an arrangement pattern 2) of k-space frames.
Figure 5:
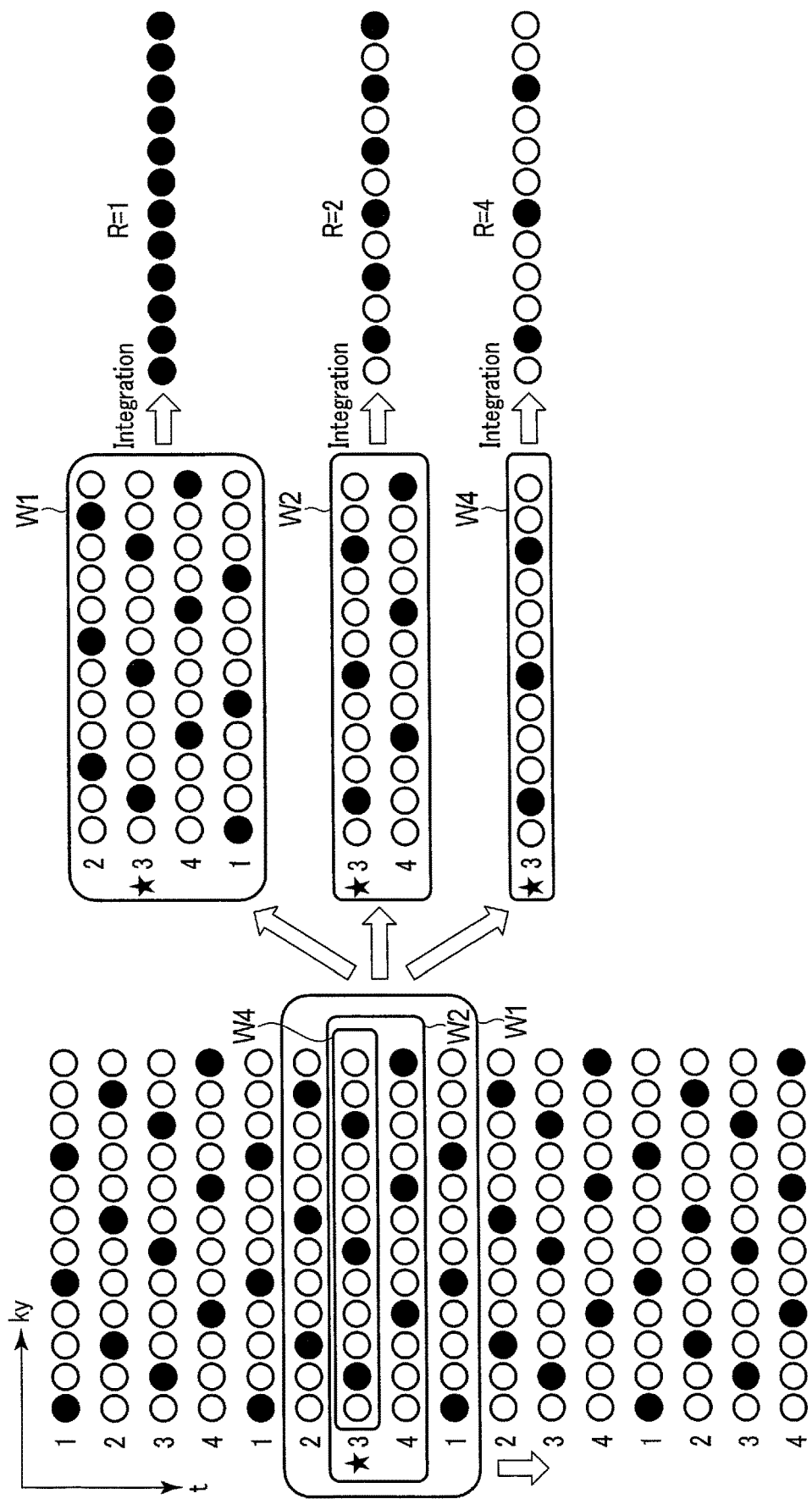
FIG. 5 is a diagram schematically showing an integration process (a base frame is an arrangement pattern 3) of k-space frames.

FIGS. 4 and 5 are diagrams schematically showing an integration process of k-space frames. It is assumed that a k-space frame of an arrangement pattern 2 is an application reference in FIG. 4, and a k-space frame of an arrangement pattern 3 is an application reference in FIG. 5. As shown in FIGS. 4 and 5, in a case of the reduction factor R=4, an integration window W1 corresponding to the reduction factor R=1, an integration window W2 corresponding to the reduction factor R=2, and an integration window W4 corresponding to the reduction factor R=4 are set. The k-space frames (hereinafter referred to as the base frame) of the application reference of all the integration windows W1, W2, and W4 are the same. The base frames are indicated by stars in FIGS. 4 and 5, etc. The integration windows W1, W2, and W4 each extract and integrate the number of k-space frames corresponding to a corresponding reduction factor. In a k-space frame after integration, sample points are located at an equal interval according to that reduction factor. The time resolution is improved in the order of the integration windows W1, W2, and W4. It is not essential to include data that is not under-sampled as the time resolution. For example, under-sampling may be performed by a method of generating data of R=2 when all frames are integrated. Alternatively, for example, when under-sampling is applied to two directions ky and kz and the integration process is applied only to ky of the two, kz (to which the integration process is not applied) is in an under-sampled state.

In the present embodiment, a process target for the integration windows W1 and W2 is k-space frames including the base frame. For example, since the integration window W1 corresponds to the reduction factor R=1, it extracts and integrates four k-space frames in time series including the base frame so that the sample points after integration are arranged at an interval corresponding to the reduction factor R=1. A position of the base frame in the integration window W1 is not particularly limited. It is assumed that the position of the base frame in the integration window W1 in FIGS. 4 and 5 is second. That is, the integration window W1 includes the base frame, a k-space frame that precedes the base frame in time, and k-space frames that follow the base frame in time.

Since the integration window W2 corresponds to the reduction factor R=2, it extracts and integrates two k-space frames in time series including the base frame so that the sample points after integration are arranged at an interval corresponding to the reduction factor R=2. A position of the base frame in the integration window W2 is also not particularly limited. At this time, the position of the base frame in the integration window W2 may be set to a different position for each application so that the sample points after integration are arranged at an interval corresponding to the reduction factor R=2. Specifically, when the k-space frame of the arrangement pattern 2, which is the base frame, and the k-space frame of the arrangement pattern 1, which precedes it in time, are integrated, all the sample points are arranged at an equal interval corresponding to the reduction factor R=2. However, when the k-space frame of the arrangement pattern 2 and the k-space frame of the arrangement pattern 3, which follows it in time, are integrated, the sample points are not arranged at an equal interval. Therefore, as shown in FIG. 4, when the base frame is the arrangement pattern 2, it is the arrangement pattern 1 in which all the sample points after integration are arranged at an equal interval corresponding to the reduction factor R=2 among the arrangement pattern 1 and the arrangement pattern 3 having a time-series relationship with the arrangement pattern 2. Thus, the k-space frames of the arrangement pattern 2 and the arrangement pattern 1 are integrated. As shown in FIG. 5, when the base frame is the arrangement pattern 3, the k-space frames of the arrangement pattern 3 and the arrangement pattern 4 are integrated for the same reason.

In the present embodiment, the sequence control circuitry 29 performs under-sampled data acquisition so as to locate sample points discontinuously in a predetermined direction (e.g., the phase encoding direction) in k-space along a temporal axis so that when k-space frames are integrated along the time series in each of a plurality of integration patterns, the sample points are arranged at an equal interval in each of a plurality of k-space frames. In the present embodiment, by integrating a plurality of acquired k-space frames in time series, the sample points after integration are located at an equal interval corresponding to a desired time resolution. In other words, arrangement patterns of the sample points in the under-sampled data acquisition are set so that the sample points after integration are located at an equal interval corresponding to the desired time resolution. At this time, the arrangement patterns may be set so that a uniform arrangement of the sample points is realized by varying a position of a base frame in an integration window.

Figure 6:
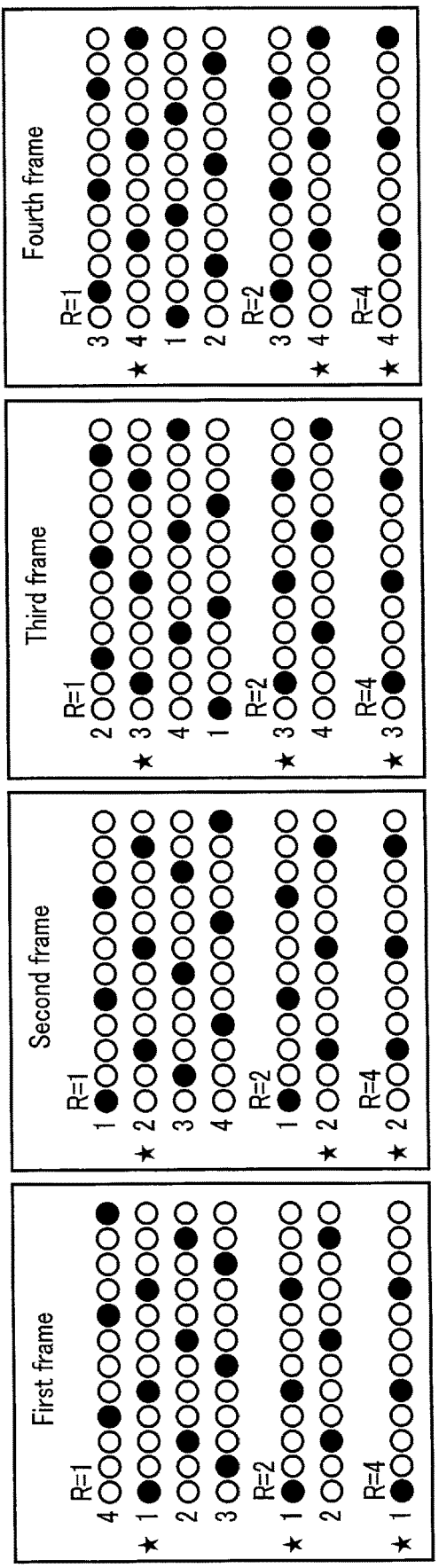
FIG. 6 is a diagram showing an arrangement pattern of a k-space frame extracted by each integration window.

FIG. 6 is a diagram showing an arrangement pattern of k-space frames extracted by each integration window. The first frame is a frame in which the base frame is the arrangement pattern 1, the second frame is a frame in which the base frame is the arrangement pattern 2, the third frame is a frame in which the base frame is the arrangement pattern 3, and the fourth frame is a frame in which the base frame is the arrangement pattern 4. As shown in FIG. 6, by the integration function 513, k-space frames respectively corresponding to a plurality of time resolutions (reduction factors) are generated for each frame (each time).

When step S2 is performed, the processing circuitry 51 converts a plurality of k-space frames generated in step S2 into a plurality of time-series images through implementation of the reconstruction function 514 (step S3). In step S3, the processing circuitry 51 performs image conversion on each of the plurality of k-space frames, thereby converting them into the plurality of time-series images related to the plurality of time resolutions. The image conversion method is not particularly limited as long as it converts a k-space frame into an image, and for example, Fourier transform such as FFT (fast Fourier transform), parallel imaging reconstruction, compression sensing reconstruction, machine-learning reconstruction, etc. are possible. Here, a case in which SENSE in a subtraction frame, which is an application of parallel imaging reconstruction, is used as the image conversion will be described.

FIG. 7 is a diagram showing a processing example of image conversion using SENSE in a subtraction frame. Note that FIG. 7 illustrates processing for one k-space frame $K_n$ (1≤n≤N) among a set of k-space frames $K_1$ to $K_N$ (N is a natural number of 2 or more, which represents the number of k-space frames included in the k-space frames).

As shown in FIG. 7, the processing circuitry 51 extracts one k-space frame $K_n$ to be processed from the k-space frames $K_1$ to $K_N$. The k-space frame $K_n$ to be processed may be extracted from the k-space frames $K_1$ to $K_N$ in any order. Next, the processing circuitry 51 performs averaging processing on the k-space frames $K_1$ to $K_N$, and generates an average k-space frame Kave based on the k-space frames $K_1$ to $K_N$ (step S31). Specifically, the average k-space frame Kave is generated by adding the k-space frames $K_1$ to $K_N$ and dividing the result by N. Instead of simple addition, weighted addition in which the k-space frames $K_1$ to $K_N$ are weighted may be performed. Since the average k-space frame Kave includes k-space data at all sample points, it corresponds to full sampling data.

When step S31 is performed, the processing circuitry 51 performs subtraction processing on the k-space frame $K_n$ to be processed and the average k-space frame Kave, and generates a subtraction frame $Ksub_n$ based on the k-space frame $K_n$ to be processed and the average k-space frame Kave (step S32). The subtraction frame $Ksub_n$ is specifically generated by performing subtraction processing on the k-space frame $K_n$ and the average k-space frame Kave for each sample point. It is k-space data related to a fluctuation part from the average k-space frame Kave to the k-space frame $K_n$.

When step S32 is performed, the processing circuitry 51 performs SENSE reconstruction on the subtraction frame $Ksub_n$ using a sensitivity map to generate a subtracted image $Isub_n$ (step S33). SENSE reconstruction is an image reconstruction method for reconstructing an image of an aliasing artifact from k-space data obtained by under-sampling (under-sampled data acquisition) using sensitivity differences of a plurality of receiver coils.

Figure 8:
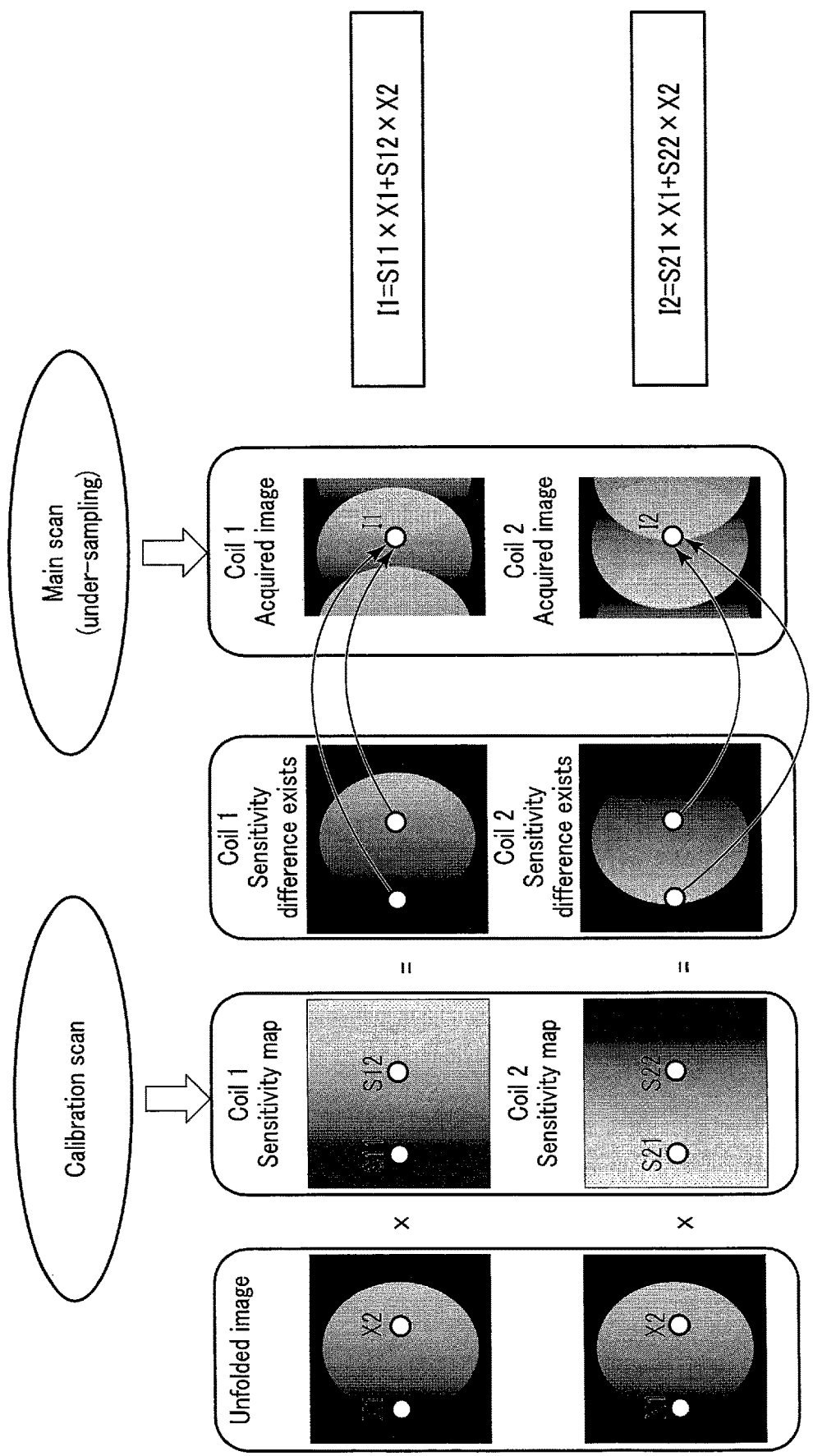
FIG. 8 is a diagram showing an outline of SENSE reconstruction.

FIG. 8 is a diagram showing an outline of SENSE reconstruction. FIG. 8 shows an example using two receiver coils. It can also be expanded to a case in which three or more receiver coils are used. As shown in FIG. 8, an acquired image of a coil 1 and an acquired image of a coil 2 are acquired by a main scan (the under-sampled data acquisition in step S1). As described above, k-space data is under-sampled in the under-sampled data acquisition. In both images, an aliasing artifact due to the under-sampling is drawn. A calibration scan is performed prior to the main scan. By the calibration scan, a sensitivity map of the coil 1 and a sensitivity map of the coil 2 are acquired. The sensitivity map represents spatial distribution of the sensitivity of each coil.

A pixel value of each pixel of an acquired image with an aliasing artifact can be expressed as a weighted addition of a pixel value (sensitivity) of a corresponding pixel of a sensitivity map to a pixel value of a corresponding pixel of an unfolded image without an aliasing artifact. Specifically, a pixel value I1 of a certain pixel of the acquired image of the coil 1 can be obtained based on pixel values X1 and X2 of corresponding pixels of the unfolded image and sensitivities S11 and S12 of corresponding pixels of the sensitivity map as shown in formula (1), and a pixel value I2 of a certain pixel of the acquired image of the coil 2 can be obtained based on pixel values X1 and X2 of corresponding pixels of the unfolded image and sensitivities S21 and S22 of corresponding pixels of the sensitivity map as shown in formula (2). An unfolded image can be calculated by solving simultaneous equations of formulae (1) and (2) for all pixels of an image.

$$I1 = S11 \times X1 + S12 \times X2 \quad (1)$$

$$I2 = S21 \times X1 + S22 \times X2 \quad (2)$$

On the other hand, when step S32 is performed, the processing circuitry 51 applies FFT to the average k-space frame Kave to generate an image (hereinafter, referred to as an average image) Iave (step S34). The average image Iave represents spatial distribution of a fluctuation part from the average k-space frame Kave to the k-space frame $K_n$. In this example, since there is no under-sampling of sample points in the average k-space frame Kave, no aliasing artifact occurs. A method of generating the average image Iave from the average k-space frame Kave is not limited to the FFT, and may be generated by using any method. For example, if the sample points in the average k-space frame Kave are under-sampled data corresponding to R=2, the same processing (SENSE reconstruction) as in S33 may be used as S34. If there is no under-sampling of sample points in the average k-space frame Kave, the average k-space frame Kave may be used as self-calibration data in place of or in combination with the calibration scan shown in FIG. 8.

When steps S33 and S34 are performed, the processing circuitry 51 applies an addition process to the subtracted image $Isub_n$ and the average image Iave to generate an image (hereinafter, referred to as an addition image) $Iadd_n$ (step S35). The addition image $Iadd_n$ corresponds to a high-quality image based on the k-space frame $K_n$.

The processes of steps S32 to S35 are performed for all k-space frames $K_n$ included in the k-space frames $K_1$ to $K_N$. As a result, time-series images corresponding to the k-space frames $K_1$ to $K_N$ are generated. The processes of steps S31 to S35 are performed for the plurality of k-space frames respectively corresponding to the plurality of time resolutions generated in step S2. As a result, a plurality of time-series images respectively corresponding to the plurality of time resolutions are generated. As described above, according to the image conversion shown in FIG. 7, in order to generate a plurality of time-series images, the processing circuitry 51 calculates, for each of a plurality of k-space frames, a subtraction frame by subtracting an average k-space frame of those k-space frames from each of those k-space frames, and generates a time-series combined image by combining each time-series subtracted image based on the subtraction frame and an average image based on the average k-space frame.

According to the present embodiment, when preparing a plurality of k-space frames related to a plurality of time resolutions, k-space frames to be used for integration are extracted and integrated from original k-space frames so that sample points of each k-space frame after integration are arranged at an equal interval according to each time resolution. Since generation of complicated aliasing components that occurs when sample points are arranged at an unequal interval is suppressed, it is possible to improve an image quality of a time-series image.

When step S3 is performed, the processing circuitry 51 generates a single time-series image from the plurality of time-series images generated in step S3 through implementation of the reconstruction function 514 (step S4). In the present embodiment, the processing circuitry 51 uses a machine-learning model and generates a single high-definition time-series image in which an artifact caused by signal loss due to under-sampled data acquisition is reduced from the plurality of time-series images. As the machine-learning model, a neural network is used.

Figure 9:
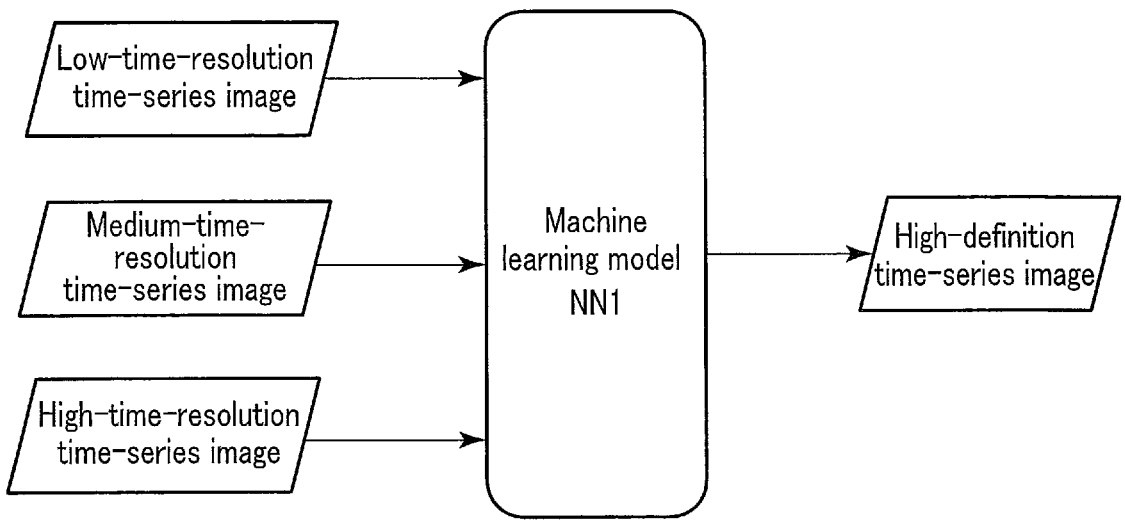
FIG. 9 is a diagram schematically showing an input/output example of a machine-learning model NN1.

FIG. 9 is a diagram schematically showing an input/output example of a machine-learning model NN1. As shown in FIG. 9, the machine-learning model NN1 is a neural network trained to input a plurality of time-series images and output a high-definition time-series image. For example, in the example shown in FIG. 9, three time-series images, a low-time-resolution time-series image, a medium-time-resolution time-series image, and a high-time-resolution time-series image, are input as a plurality of time-series images. The number of time-series images to be input is not limited to three, and may be any number as long as it is two or more. A time resolution of the high-definition time-series image, which is the output, depends on a time resolution of output samples for training used for machine learning, but can be set discretionarily. For example, the time resolution of the high-definition time-series image is set to a time resolution of the high-time-resolution time-series image.

The machine-learning model NN1 is trained based on a large number of pre-acquired training samples. The training samples include input samples for training and output samples for training. The input samples for training contain a plurality of time-series images related to a plurality of time resolutions. The output samples for training contain a single high-definition time-series image. For example, as the input samples for training, the plurality of time-series images generated by the processes of steps S1 to S3 may be used. For example, as the output samples for training, a time-series image based on k-space frames acquired by full-sampling data acquisition may be used. An untrained machine-learning model should be trained based on supervised learning by combining input samples for training and output samples for training. Specifically, learning parameters may be updated so as to minimize an error between an output sample obtained by progressively propagating input samples for training to the untrained machine-learning model and output samples for training. The learning parameters are parameters of a neural network trained by machine learning, for example, a weighting factor and a bias. The machine-learning model NN1 is generated by setting learning parameters after update to an untrained machine-learning model.

The machine-learning model NN1 may be formed to input/output an image in units of one frame, to input/output an image in units of a plurality of frames, or to input/output an image in units of all frames.

Since the machine-learning model NN1 outputs a single time-series image from a plurality of time-series images respectively corresponding to a plurality of time resolutions, it is possible to compensate for deterioration due to under-sampled data acquisition from information in the vicinity in time.

In step S4, a machine-learning model that performs other input/output may be used.

Figure 10:
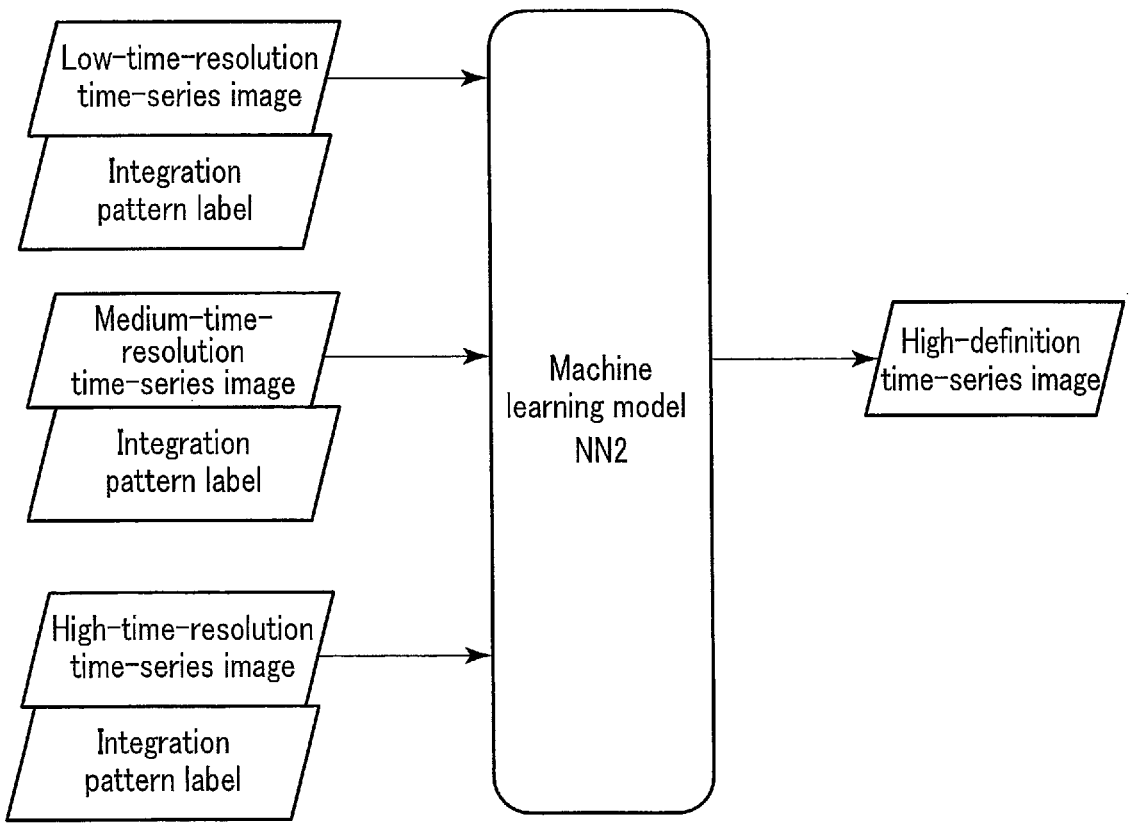
FIG. 10 is a diagram schematically showing an input/output example of a machine-learning model NN2.

FIG. 10 is a diagram schematically showing an input/output example of a machine-learning model NN2. As shown in FIG. 10, the machine-learning model NN2 inputs a plurality of time-series images and integration pattern labels and outputs a single high-definition time-series image. The integration pattern label is a label for identifying an integration pattern of each image forming the time-series image. Specifically, as the integration pattern label, a one-hot vector that identifies a position of a base frame in an integration window corresponding to that image is used. For example, in a case of an integration window corresponding to the reduction factor R=2, when a base frame and a k-space frame preceding that base frame in time are integrated, (0, 1) is used as the integration pattern label, and when the base frame and a k-space frame following that base frame in time are integrated, (1, 0) may be used as the integration pattern label. Integration pattern labels can be defined for other reduction factors in the same manner. By inputting an integration pattern label, the machine-learning model NN2 can recognize a position of a base frame, so that it is possible to generate a high-definition time-series image in consideration of the position of the base frame.

The high-definition time-series image may be generated without using the machine-learning model. For example, the processing circuitry 51 may generate a high-definition time-series image by adding and averaging a plurality of time-series images in the same frame unit. Further, the processing circuitry 51 may generate a high-definition time-series image by performing compressed sensing, etc. on a plurality of time-series images.

When step S4 is performed, the processing circuitry 51 displays the time-series image generated in step S4 through implementation of the display control function 516 (step S5). The time-series image is dynamically displayed on the display 53, etc. This allows the user to observe high-definition time-series images.

When step S5 is performed, the MR examination shown in FIG. 2 is completed.

The above embodiment is an example, and the present embodiment is not limited thereto. In the following, some modifications according to the present embodiment will be described.

(First Modification)

In the above embodiment, a plurality of k-space frames that are continuous in time are integrated. Thus, it is assumed that the arrangement patterns of sample points in the under-sampled data acquisition are set so that the sample points will be arranged at an equal interval in a k-space frame after integration. In this case, as shown in FIGS. 4 and 5, in the under-sampled data acquisition, the sample points are located discontinuously in k-space with a passage of time. In the first modification, under-sampled data acquisition is performed so that sample points are located continuously in k-space with a passage of time. In the following, an integration process of frames according to the first modification will be described.

Figure 11:
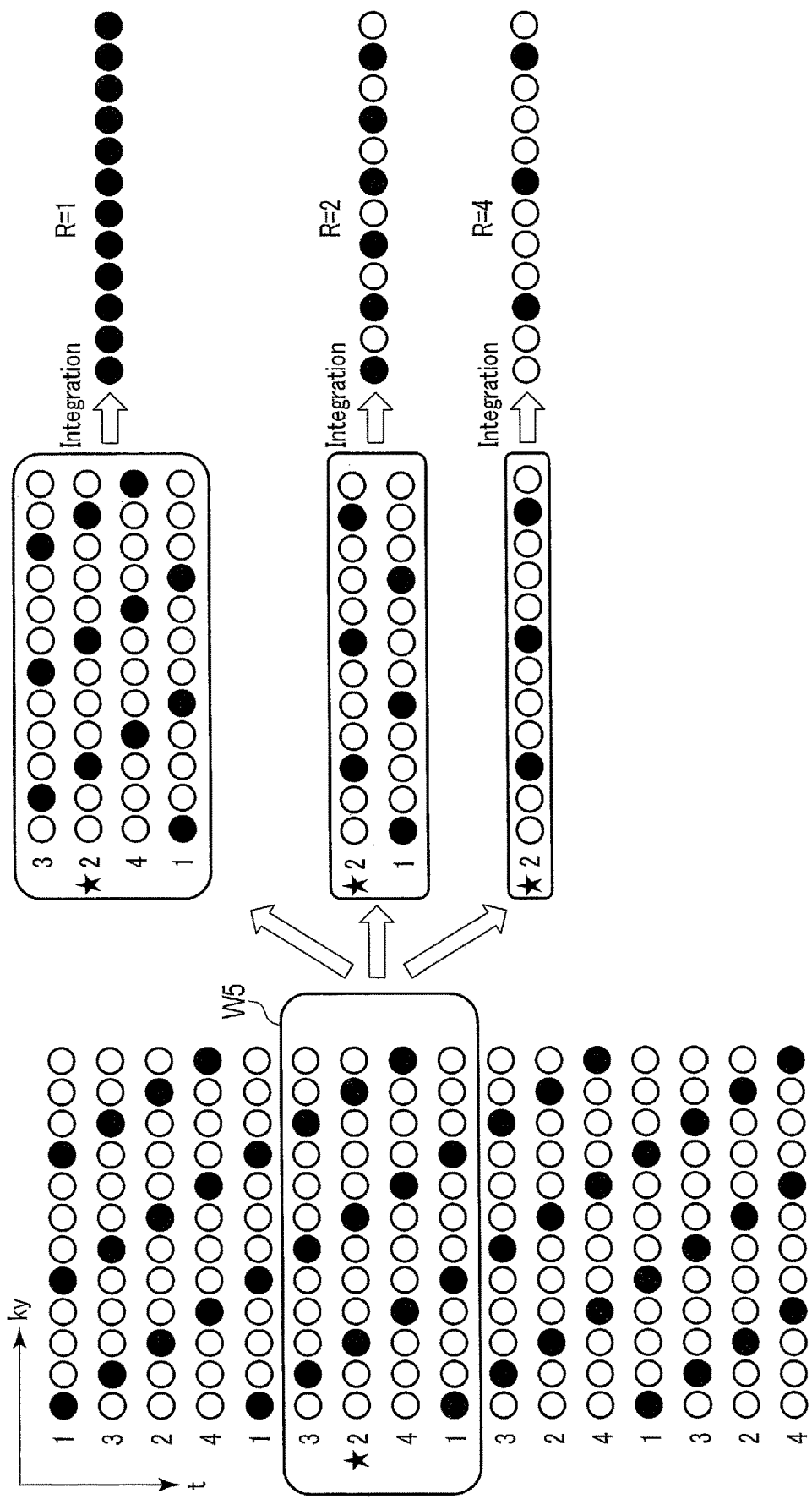
FIG. 11 is a diagram schematically showing an integration process of k-space frames according to a first modification.

FIG. 11 is a diagram schematically showing the integration process of k-space frames according to the first modification. The numbers of arrangement patterns match the numbers of the arrangement patterns shown in FIGS. 4 and 5. As shown in FIG. 11, in the first modification, the sequence control circuitry 29 performs under-sampled data acquisition so as to locate sample points continuously in a predetermined direction in k-space along a temporal axis. That is, the arrangement pattern 1→the arrangement pattern 3→the arrangement pattern 2→the arrangement pattern 4 is cyclically repeated in time series. An integration window W5 corresponding to the reduction factor R=1 is sequentially applied in time series to the time series k-space frames.

The processing circuitry 51 extracts, from k-space frames included in the integration window W5, a combination of k-space frames according to a desired time resolution or reduction factor so that sample points are arranged at an equal interval in a k-space frame after integration. The extracted k-space frames do not have to be continuous in time. As shown in FIG. 11, when the base frame is the arrangement pattern 2 and a k-space frame having the reduction factor R=2 is generated, k-space frames of the arrangement pattern 2 and the arrangement pattern 1 separated in time are extracted so that an interval of sample points of a k-space frame after integration is two.

As described above, in the first modification, the under-sampled data acquisition is performed so that the sample points are located continuously in the k-space with the passage of time, and the number of k-space frames corresponding to a desired time resolution are extracted from the acquired k-space frames so that the sample points after integration are located at an equal interval corresponding to that desired time resolution. At this time, a plurality of k-space frames separated in time are allowed to be extracted. This makes it possible to reduce a mechanical load because it is not necessary to perform a complicated sample point position manipulation at the time of under-sampled data acquisition.

(Second Modification)

In some embodiments described above, for example, as shown in FIGS. 4 and 5, it is assumed that the arrangement patterns in the under-sampled data acquisition are repeated cyclically such as the arrangement pattern 1→the arrangement pattern 2→the arrangement pattern 3→the arrangement pattern 4→the arrangement pattern 1→the arrangement pattern 2→the arrangement pattern 3→the arrangement pattern 4 . . . However, the present embodiment is not limited thereto. For example, the arrangement patterns may be repeated reciprocally such as the arrangement pattern 1→the arrangement pattern 2→the arrangement pattern 3→the arrangement pattern 4→the arrangement pattern 3→the arrangement pattern 2→the arrangement pattern 1 . . . At this time, it is preferable that a position of a base frame in an integration window be adjusted in time so that sample points of a k-space frame after integration are arranged at an equal interval.

(Third Modification)

In some embodiments described above, it is presumed that the sample points are arranged at an equal interval over the entire phase encoding direction (ky direction). However, the present embodiment is not limited thereto. The sample points may not be arranged at an equal interval over the phase encoding direction (ky direction), and may be allowed to be arranged at an unequal interval locally. For example, in parallel imaging of a k-space method such as GRAPPA (generalized autocalibrating partially parallel acquisitions), additional data acquisition (ACS data acquisition) may be performed for sample points under-sampled in a k-space central part. It corresponds to full sampling in the k-space central part where the additional data acquisition is performed and to under-sampling in a k-space peripheral part.

In this case, the sample points will be arranged at an unequal interval in a relationship between the k-space central part where the additional data acquisition is performed and the k-space peripheral part where the additional data acquisition is not performed. Even in such a case, it is possible to focus on the k-space peripheral part and perform an integration process of k-space frames. For example, a plurality of k-space frames may be extracted and integrated so that sample points in a k-space peripheral part of a k-space frame after integration are arranged at an equal interval corresponding to a time resolution (reduction factor) of the k-space frame after integration.

That is, according to the present embodiment, it suffices that in acquired k-space frames and a plurality of integrated k-space frames, the sample points are arranged at a regular interval over the entire region or locally in the phase encoding direction of the k-space.

(Fourth Modification)

Generation of a plurality of k-space frames by the integration function 513 and/or reconstruction of time-series images by the reconstruction function 514 may be incorporated into a portion of iterative optimization using MoDL (Model-based Deep Learning), etc.

(Additional Remarks)

In some embodiments described above, the magnetic resonance imaging apparatus 1 has the sequence control circuitry 29 and the processing circuitry 51. The sequence control circuitry 29 performs under-sampled data acquisition whose sample points are located at an equal interval in k-space and acquires k-space frames. The processing circuitry 51 generates a plurality of k-space frames related to a plurality of time resolutions based on the k-space frames. In each of the plurality of k-space frames, sample points are located at an equal interval, and the interval differs for each of the plurality of k-space frames. The processing circuitry 51 generates a single time-series image based on the plurality of k-space frames.

According to the above configuration, regarding under-sampled data acquisition, it becomes possible to generate a single high-definition time-series image based on a plurality of k-space frames related to a plurality of time resolutions. At this time, when preparing the plurality of k-space frames, sample points of each k-space frame after integration are arranged at an equal interval according to each time resolution. In a plurality of time-series images based on such a plurality of k-space frames, generation of complicated aliasing components that occurs when the sample points are arranged at an unequal interval is suppressed. As a result, it is expected that an image quality of a single time-series image based on a plurality of time-series images will also be improved.

According to at least one embodiment described above, an image quality of an image obtained by under-sampled data acquisition can be improved.

The term "processor" used in the above descriptions means, for example, a CPU, a CPU, or circuitry such as an application specific integrated circuit (ASIC) or a programmable logic device (e.g., a simple programmable logic device (SPLD), a complex programmable logic device (CPLD), or a field programmable gate array (FPGA)). The processor realizes a function by reading and executing a program stored in storage circuitry. Instead of storing the program in the storage circuitry, the program may be directly embedded in circuitry of the processor. In this case, the processor realizes the function by reading and executing the program embedded in the circuitry. Further, instead of executing the program, a function corresponding to that program may be realized by a combination of logic circuits. It should be noted that each processor of the present embodiment is not limited to the case where each processor is formed as a single circuit, and a plurality of independent circuits may be combined to form one processor to realize its function. Furthermore, the plurality of components in FIG. 1 may be integrated into one processor to realize its function.

Regarding the foregoing embodiments, the following additional notes are disclosed as one aspect and selective features of the invention.

(Additional Note 1)

A magnetic resonance imaging apparatus including sequence control circuitry and processing circuitry, in which the sequence control circuitry performs under-sampled data acquisition whose sample points are located at an equal interval in k-space and acquires k-space frames, and the processing circuitry generates a plurality of k-space frames related to a plurality of time resolutions based on the k-space frames, the plurality of k-space frames each including sample points located at an equal interval, the interval differing for each of the plurality of k-space frames, and generates a time-series image based on the plurality of k-space frames.

(Additional Note 2)

The processing circuitry may generate the plurality of k-space frames by integrating a plurality of k-space frames included in the k-space frames in each of a plurality of integration patterns related to the plurality of time resolutions.

(Additional Note 3)

The integration unit may generate the plurality of k-space frames by sequentially extracting, from the k-space frames, and integrating the number of k-space frames according to a time resolution or reduction factor corresponding to each of the plurality of patterns while staggering the time.

(Additional Note 4)

The processing circuitry may generate the plurality of k-space frames by sequentially applying an integration window according to a time resolution or reduction factor corresponding to each of the plurality of patterns to the k-space frames while staggering the time, and fix or vary a position of a base frame in the integration window in time when the integration window is applied to the k-space frames.

(Additional Note 5)

The sequence control circuitry may perform the under-sampled data acquisition so as to discontinuously locate sample points in a predetermined direction of k-space along a temporal axis so that sample points are arranged at an equal interval in each of the plurality of k-space frames when the k-space frames are integrated along a time series in each of the plurality of patterns, and the processing circuitry may integrate the number of k-space frames that are continuous in time so that sample points are arranged at an equal interval in each of the plurality of k-space frames.

(Additional Note 6)

The sequence control circuitry may perform the under-sampled data acquisition so as to continuously locate sample points in a predetermined direction of k-space along a temporal axis, and the processing circuitry may integrate the number of k-space frames that are continuous in time so that sample points are arranged at an equal interval in each of the plurality of k-space frames.

(Additional Note 7)

The processing circuitry may convert the plurality of k-space frames into a plurality of time-series images, and generate the time-series image based on the plurality of time-series images.

(Additional Note 8)

In order to generate the plurality of time-series images, the processing circuitry may calculate, for each of the plurality of k-space frames, a subtraction frame by subtracting an average frame of those k-space frames from each of those k-space frames, and generate a time-series combined image by combining each time-series subtracted image based on the subtraction frame and an average image based on the average frame.

(Additional Note 9)

The processing circuitry may apply the plurality of time-series images to a machine-learning model and generate the time-series image in which an artifact caused by signal loss due to the under-sampled data acquisition is reduced.

(Additional Note 10)

The processing circuitry may generate the time-series image by applying the plurality of time-series images and a plurality of labels respectively corresponding to the plurality of time-series images to a machine-learning model.

Each of the plurality of labels may represent a pattern related to integration of k-space frames used for conversion of a corresponding time-series image.

(Additional Note 11)

In the k-space frames and the plurality of k-space frames, sample points may be arranged at a regular interval over an entire region or locally in a phase encoding direction of the k-space.

(Additional Note 12)

The sequence control circuitry may perform the under-sampled data acquisition while changing an arrangement of the sample points in the k-space in time series.

(Additional Note 13)

A magnetic resonance imaging method including an acquisition step of acquiring k-space frames by performing under-sampled data acquisition whose sample points are located at an equal interval in k-space, an integration step of generating a plurality of k-space frames related to a plurality of time resolutions based on the k-space frames, the plurality of k-space frames each including sample points located at an equal interval, the interval differing for each of the plurality of k-space frames, and a reconstruction step of generating a time-series image based on the plurality of k-space frames.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising sequence control circuitry and processing circuitry, wherein
the sequence control circuitry is configured to perform under-sampled data acquisition whose sample points are located at an equal interval in k-space and acquire k-space frames, and
the processing circuitry is configured to:
generate a plurality of k-space frames related to a plurality of time resolutions based on the k-space frames, the plurality of k-space frames each including sample points located at an equal interval, the interval differing for each of the plurality of k-space frames; and
generate a time-series image based on the plurality of k-space frames.

2. The magnetic resonance imaging apparatus according to claim 1, wherein the processing circuitry is configured to generate the plurality of k-space frames by integrating a plurality of k-space frames included in the k-space frames in each of a plurality of patterns related to the plurality of time resolutions.

3. The magnetic resonance imaging apparatus according to claim 2, wherein the processing circuitry is configured to generate the plurality of k-space frames by sequentially extracting, from the k-space frames, and integrating a number of k-space frames according to a time resolution or a reduction factor corresponding to each of the plurality of patterns while staggering a time.

4. The magnetic resonance imaging apparatus according to claim 3, wherein the processing circuitry is configured to:
generate the plurality of k-space frames by sequentially applying an integration window according to the time resolution or the reduction factor corresponding to each of the plurality of patterns to the k-space frames while staggering the time; and
fix or vary a position of a base frame in the integration window in time when the integration window is applied to the k-space frames.

5. The magnetic resonance imaging apparatus according to claim 3, wherein
the sequence control circuitry is configured to perform the under-sampled data acquisition so as to discontinuously locate the sample points in a predetermined direction of the k-space along a temporal axis so that the sample points are arranged at the equal interval in each of the plurality of k-space frames when the k-space frames are integrated along a time series in each of the plurality of patterns, and
the processing circuitry is configured to integrate the number of k-space frames that are continuous in time so that the sample points are arranged at the equal interval in each of the plurality of k-space frames.

6. The magnetic resonance imaging apparatus according to claim 3, wherein
the sequence control circuitry is configured to perform the under-sampled data acquisition so as to continuously locate the sample points in a predetermined direction in the k-space along a temporal axis, and
the processing circuitry is configured to integrate the number of k-space frames that are discontinuous in time so that the sample points are arranged at the equal interval in each of the plurality of k-space frames.

7. The magnetic resonance imaging apparatus according to claim 1, wherein the processing circuitry is configured to:
convert the plurality of k-space frames into a plurality of time-series images; and
generate the time-series image based on the plurality of time-series images.

8. The magnetic resonance imaging apparatus according to claim 7, wherein in order to generate the plurality of time-series images, the processing circuitry is configured to calculate, for each of the plurality of k-space frames, a subtraction frame by subtracting an average frame of the k-space frames from each of the k-space frames, and generate a time-series combined image by combining each time-series subtracted image based on the subtraction frame and an average image based on the average frame.

9. The magnetic resonance imaging apparatus according to claim 7, wherein the processing circuitry is configured to apply the plurality of time-series images to a machine-learning model and generate the time-series image in which an artifact caused by signal loss due to the under-sampled data acquisition is reduced.

10. The magnetic resonance imaging apparatus according to claim 9, wherein
the processing circuitry is configured to apply the plurality of time-series images and a plurality of labels respectively corresponding to the plurality of time-series images to the machine-learning model and generate the time-series image, and
each of the plurality of labels represents a pattern related to integration of k-space frames used for conversion of a corresponding time-series image.

11. The magnetic resonance imaging apparatus according to claim 1, wherein in the k-space frames and the plurality of k-space frames, the sample points are arranged at a regular interval over an entire region or locally in a phase encoding direction of the k-space.

12. The magnetic resonance imaging apparatus according to claim 1, wherein the sequence control circuitry is configured to perform the under-sampled data acquisition while changing an arrangement of the sample points in the k-space in time series.

13. A magnetic resonance imaging method comprising:
acquiring k-space frames by performing under-sampled data acquisition whose sample points are located at an equal interval in k-space;
generating a plurality of k-space frames related to a plurality of time resolutions based on the k-space frames, the plurality of k-space frames each including the sample points located at an equal interval, the interval differing for each of the plurality of k-space frames; and
generating a time-series image based on the plurality of k-space frames.

* * * * *